United States Patent

Chartrefou

[11] Patent Number: 6,127,817
[45] Date of Patent: Oct. 3, 2000

[54] POCKELS CELL ELECTRO-OPTIC SENSOR COUPLED TO SOLID VOLTAGE DIVIDER

[75] Inventor: Denis Chartrefou, Epinay Sous Senart, France

[73] Assignee: GEC Alsthom T&D Balteau, Montrouge, France

[21] Appl. No.: 09/092,084

[22] Filed: Jun. 5, 1998

[30] Foreign Application Priority Data

Jun. 6, 1997 [FR] France .................................. 97 07012

[51] Int. Cl.$^7$ .................................................. G01R 31/00
[52] U.S. Cl. ........................ 324/96; 324/117 R; 324/753; 359/257
[58] Field of Search .............................. 324/753, 96, 107, 324/117 R, 244.1, 751; 359/257, 246, 279; 250/336.1

[56] References Cited

U.S. PATENT DOCUMENTS

| | | | |
|---|---|---|---|
| 5,559,442 | 9/1996 | Peier et al. ................................. | 324/96 |
| 5,635,831 | 6/1997 | Englund .................................... | 324/96 |

FOREIGN PATENT DOCUMENTS

| | | | |
|---|---|---|---|
| 2240454 | 3/1975 | France . | |
| 405060795 | 3/1993 | Japan ....................................... | 324/96 |

OTHER PUBLICATIONS

Patent Abstracts of Japan, vol. 007, No. 270 (P–240) Dec. 2, 1983 corresponding to JP 58 150869 A (Tokyo Shibaura Denki KK) Sep. 7, 1983.

Patent Abstracts of Japan, vol. 015, No. 419 (E–1126), Oct. 24, 1991 corresponding to JP 03 175606 A (Mitsvbishi Electric Corp) Jul. 30, 1991.

Patent Abstracts of Japan, vol. 018, No. 045 (P–1681), Jan. 24, 1994 corresponding to JP 05 273256 A (Furukawa Electric Co Ltd) Oct. 22, 1993.

*Primary Examiner*—Jay Patidar
*Assistant Examiner*—S. Zaveri
*Attorney, Agent, or Firm*—Sughrue, Mion, Zinn, Macpeak & Seas, PLLC

[57] ABSTRACT

An electro-optic voltage sensor comprises a voltage divider connected to an electric line and to ground and having two insulative compartments separated by an intermediate electrode connected to a Pockels cell. The intermediate electrode supplies to the Pockels cell a reduced voltage derived from the voltage supplied by the electric line to the voltage divider. Each insulative compartment comprises a homogeneous dielectric block with a thickness dependent on the division ratio of the voltage divider. The electro-optic voltage sensor has a very high safety level vis à vis the risk of strong short-circuits combined with mechanical and thermal stability guaranteeing great accuracy of operation and great reliability without special maintenance requirements.

13 Claims, 2 Drawing Sheets

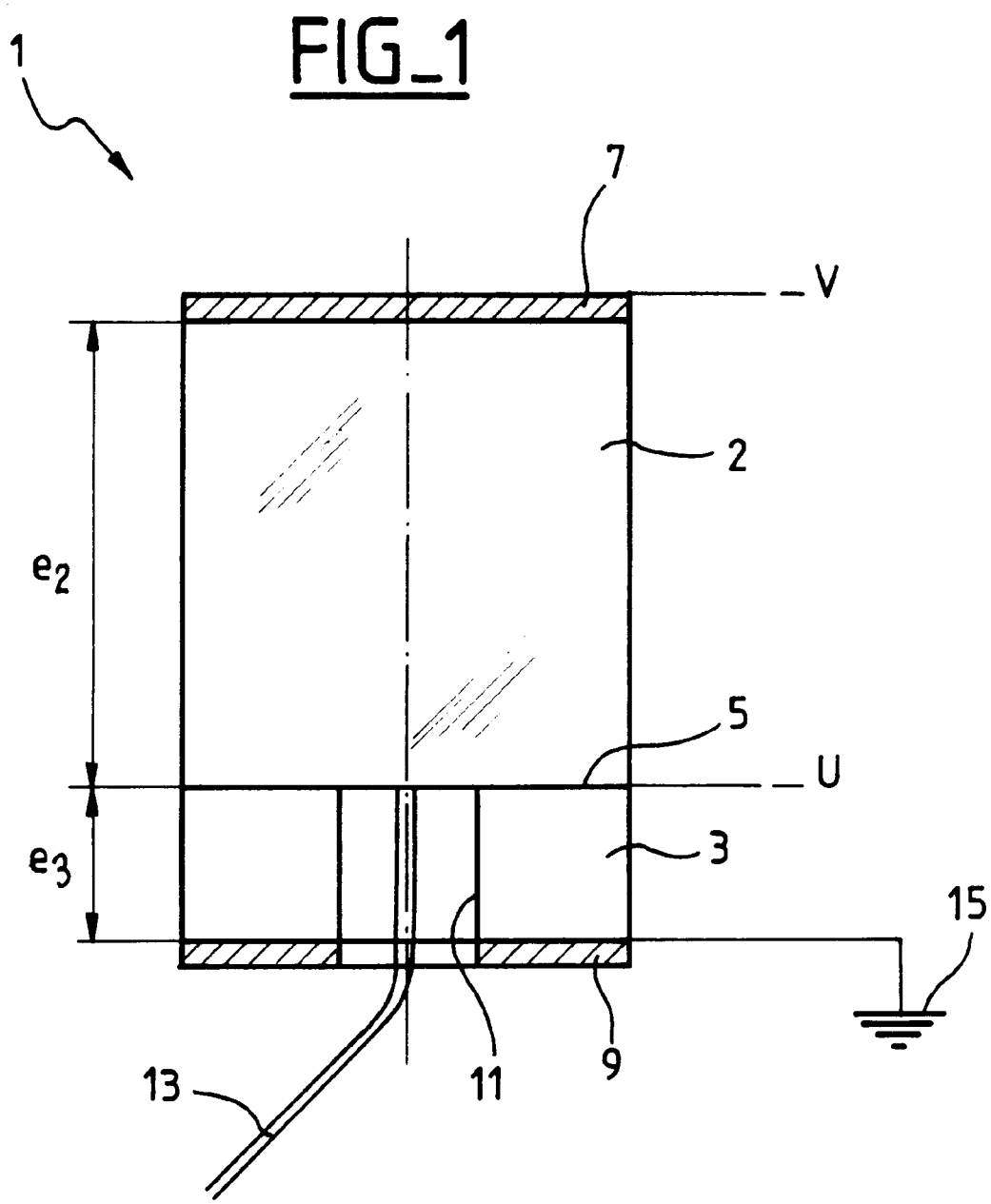

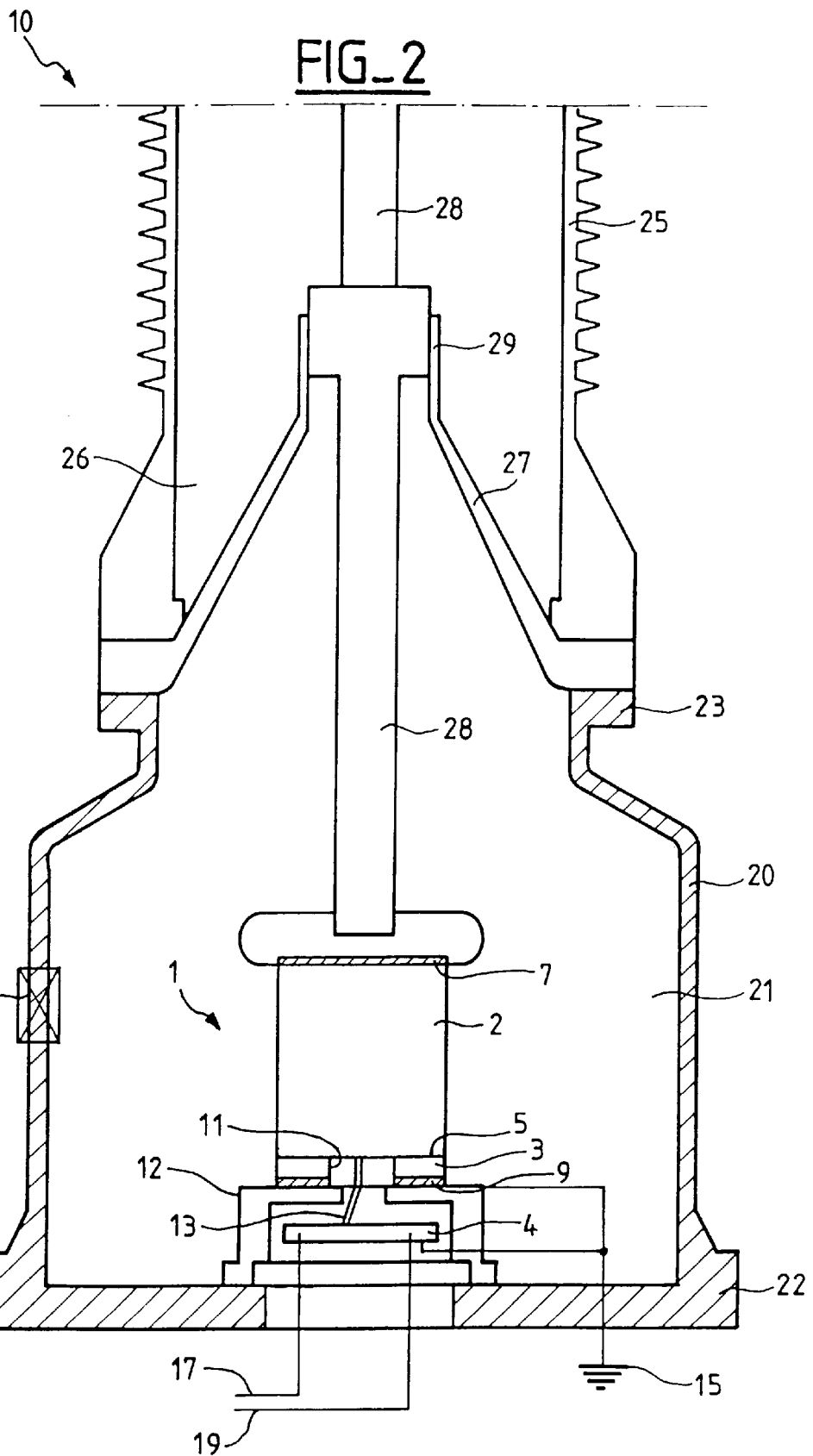

POCKELS CELL ELECTRO-OPTIC SENSOR COUPLED TO SOLID VOLTAGE DIVIDER

BACKGROUND OF THE INVENTION

1. Field of the Invention

The invention concerns an electro-optic voltage sensor for determining the voltage on an electric line, comprising a voltage divider adapted to be connected to the electric line and to ground and having two insulative compartments separated by an intermediate electrode connected to a Pockels cell, the intermediate electrodes supplying to the Pockels cell a reduced voltage derived from the voltage supplied by the electric line to the voltage divider.

2. Description of the Prior Art

A sensor of the above kind is used in distribution networks to determine the voltage on electric lines needed for "Metering" transmission and "Protecting" the network.

The Pockels cell comprises an electro-optic crystal, for example an oxide of bismuth and germanium or of bismuth and silicon. The Pockels effect is the name of the phenomenon whereby birefringence of the crystal is caused by application of an electric voltage between two faces of the crystal covered with a conductive deposit.

The Pockels cell also comprises an input optical fiber connected to a light-emitting diode emitting an incident light beam through a polarizer and a phase-shifter plate. On passing through the electro-optic crystal the polarization of the incident light beam varies. An analyzer on the path of the transmitted light beam converts the polarization variation at the output of the crystal into a variation of luminous intensity conveyed by an output optical fiber to a photodiode detector in a remote electronic unit.

The polarization variation depends on the voltage applied between the conductive faces of the electro-optic crystal.

It can be shown that in one particular mode of operation of the Pockels cell the ratio of the instantaneous luminous power received by the photodiode to the continuous power emitted by the light-emitting diode depends on the applied voltage U in the form of a sine of the product k*U where $\underline{k}$ is an electro-optic coupling coefficient characteristic of the crystal of the Pockels cell used.

The Pockels cell can determine an applied voltage U up to a typical value 10,000 volts, usually called the quarter-wave voltage of the electro-optic crystal.

Beyond this limiting value, the evolution with time of the instantaneous luminous power received relative to the evolution with time of the applied voltage U is no longer monotonous.

A first solution to this problem is to double the incident light beam in order to produce another trigonometric variation of the luminous power.

This has two major drawbacks, however. First, the necessity to use a long (currently 25 cm) electro-optic crystal to withstand the voltage constitutes a technical limitation and a very high additional cost. Second, the bandwidth of the electro-optic sensor is considerably limited and is incompatible with the measurement of fast transient voltage signals like those corresponding to the specifications of the "Protection" channel.

A second solution is to associate the Pockels cell with a voltage divider. The latter generally comprises a capacitive column formed of identical individual capacitors consisting, for example, of sheets of aluminum serving as armatures separated by insulative films of paper or polypropylene, the whole being immersed in an insulative liquid, for example an oil-based liquid.

An intermediate electrode electrically connected to one of the conductive faces of the electro-optic crystal of the Pockels cell separates the capacitive column into two insulative compartments. A total voltage applied to the column generates a reduced voltage at the Pockels cell, the ratio between the voltages being determined by the capacitances of the two compartments of the column.

To determine the tension on the electric line the Pockels cell is associated with a capacitive column disposed inside and along the entire length of an insulator supporting the electric line. The length of the insulator filled with a pressurized gas is chosen according to the voltage on the electric line so that the capacitance of the two compartments divides the line voltage sufficiently for the reduced voltage to be less than the quarter-wave voltage of the electro-optic crystal of the Pockels cell used.

An electro-optic voltage sensor of the above kind gives rise to two problems, however.

First, in the event of an internal short-circuit, due for example to failure of the insulation of the capacitive column, the resulting increase in temperature and pressure generally causes the insulator to explode, whether it is made of a vitreous material such as porcelain or a composite material.

Second, the capacitive column is in practice vertical in the insulator, which can suffer mechanically caused variations in its dimensions due to differential crushing of the individual capacitors at the bottom and at the top of the column, which phenomenon can be even more marked if the oil-based insulative liquid is replaced with a gas. Thermally caused variations in its dimensions can result from differential expansion of the individual capacitors due to a temperature gradient between the bottom and the top of the column. The consequence of such dimensional variations is measurement errors incompatible with the "Metering" channel of the electro-optic sensor.

The aim of the invention is therefore to propose an electro-optic voltage sensor comprising a Pockels cell associated with a voltage divider that offers increased safety vis à vis risks of short-circuit and which confers on the sensor high reliability and high measurement accuracy.

SUMMARY OF THE INVENTION

To this end, the invention consists in an electro-optic voltage sensor for determining the voltage on an electric line, comprising a voltage divider adapted to be connected to the electric line and to ground and having two insulative compartments separated by an intermediate electrode and a Pockels cell connected to the intermediate electrode which supplies to the Pockels cell a reduced voltage derived from the voltage supplied by the electric line to the voltage divider, wherein each insulative compartment is a homogeneous dielectric block.

The two insulative compartments each consisting of a homogeneous dielectric block, the term "block" indicating that each compartment is solid, confer on the electro-optic sensor a much higher reliability vis à vis short-circuits than that of the capacitive column type voltage dividers previously described. The mechanical strength of the voltage divider is also greatly increased, the resistance to crushing of the blocks being very much greater than that of the individual capacitors using conductive and insulative films.

Other features and advantages of the invention will become apparent upon reading the following description of one embodiment of the electro-optic sensor illustrated by the drawings.

BRIEF DESCRIPTION OF THE DRAWINGS

FIG. 1 is a diagrammatic cross-section of a voltage divider with two homogeneous dielectric blocks.

FIG. 2 shows in cross-section an electro-optic voltage sensor comprising a voltage divider associated with a Pockels cell.

DETAILED DESCRIPTION OF THE PREFERRED EMBODIMENT

FIG. 1 shows a voltage divider 1 comprising two homogeneous dielectric blocks 2 and 3. Hereinafter block 2 refers to the upper block and block 3 consequently refers to the lower block. The blocks are cylindrical in shape and have identical, (for example, circular), cross-sections.

The cross-sections of the two blocks are covered with a conductive deposit, for example of aluminum, obtained by evaporation in a vacuum or by any other chemical process. The two blocks are then assembled by simply pressing them together or by gluing them together using a conductive adhesive. The deposits and the conductive adhesive together form the intermediate electrode 5. The voltage divider is itself mounted between two opposed armatures 7 and 9.

The armature 9 is at a constant or null electrical potential 15 called the ground potential; a total electric voltage V applied to the armature 7 generates a reduced voltage U at the intermediate electrode 5 at the interface between the two blocks. The division ratio R between V and U is determined by the thicknesses $e_2$ and $e_3$ of the two blocks in accordance with the equation $$R = \frac{U}{V} = \frac{e_3}{e_2 + e_3}$$

Note that the above equation presupposes that the two blocks of the voltage divider are made of the same material, but can easily be generalized to the situation in which the two blocks are made from different materials.

The lower block 3 has an axial opening 11 through which passes a contact wire 13 connected to the intermediate electrode 5.

Compared to a capacitive column with a stack of individual capacitors, in which the ratio R between the voltages V and U can assume only discrete values, the voltage divider from FIG. 1 provides a continuous ratio by way of the thicknesses $e_2$ and $e_3$.

The two compartments of the voltage divider are preferably glass or vitroceramic blocks. The latter material has a relative dielectric constant in the order of 8, i.e. higher than that of glass (in the order of 3). These materials increase the overall capacitance of the voltage divider vis à vis stray capacitance.

Note also that these materials are relatively cheap and simple to machine.

FIG. 2 shown an electro-optic voltage sensor 10 comprising a voltage divider 1 like that previously described disposed inside a shielded enclosure 20, made of metal, for example, and filled with a pressurized insulative gas 21, for example dry nitrogen $N_2$ or sulfur hexafluoride $SF_6$.

A different dry and neutral gaseous insulator may be suitable for filling the shielded enclosure, likewise a solid insulator such as polyethylene or silicone, for example, which is of benefit both from the economic point of view and for compliance with environmental protection standards.

Gas insulators compatible with the homogeneous dielectric blocks of the voltage divider dispense with the need for oil-based insulation and thus significantly reduce the risk of explosion in the event of a short-circuit between the armatures of the voltage divider.

The base 22 of the shielded enclosure is electrically connected to ground at 15. A frame 12 inside the screened enclosure 20 on the base 22 supports the voltage divider 1 and contains a Pockels cell 4 of the type previously described.

A conductive wire 13 connects the intermediate electrode 5 and a conductive face of the electro-optic crystal of the Pockels cell 4, the other conductive face being connected to ground at 15. In this way a total voltage V applied to the voltage divider generates a reduced voltage U at the lower block 3 and at the Pockels cell, the electrical impedance of which is around 1,000 times greater than that of the lower block 3.

The Pockels cell 4 contains an optical fiber 17 associated with a light-emitting diode (sender) and an optical fiber 19 associated with a photodiode (receiver) connected to an electronic unit (not shown) for acquiring signals representative of the continuous luminous power emitted and the instantaneous luminous power received. Processing the signal provides access to the reduced voltage U and calculates the total voltage V from the thickness $e_2$ and $e_3$ of the two blocks of the voltage divider.

Note that the frame can contain at least two Pockels cells assuming redundancy.

An insulator 25 made of porcelain, for example, or a composite material and of cylindrical or frustoconical shape is mechanically assembled, for example screwed, to the shielded enclosure at a fixing shoulder 23. The insulator 25 is filled with a pressurized gas 26, usually of the same kind as that 21 contained in the shielded enclosure 20, for example sulfur hexafluoride $SF_6$. A support cone 27 holds an electric conductor 28 from the electric line It can also assure sealed separation between the insulator 25 and the shielded enclosure 20.

The electric conductor 28 is disposed inside the insulator 25 and extends into the shielded enclosure through an annular opening 29 at the top of the support cone 27. The electric conductor 28 connects the armature 7 of the upper dielectric block 2 of the voltage divider 1 to an electric line (not shown) supported by the insulator 25.

The potential drop in the conductor 28 being rendered negligible by the choice of an appropriate section, the electric line carrying a voltage V supplies the same voltage to the voltage divider, the intermediate electrode 5 supplying a reduced voltage U to the Pockels cell. Determining the reduced voltage U by means of the electro-optic sensor provides access to the voltage V on the electric line.

FIG. 2 highlights the advantages of the electro-optic voltage sensor of the invention.

The insulator withstanding the electric line voltage contains only the electric conductor that transmits the voltage to the voltage divider inside the shielded enclosure. As a result the risk of short-circuit is confined to the shielded enclosure, which is designed to resist an increase in the temperature and the pressure of the insulative gas.

A rupture disk 30 opening an orifice if the pressure exceeds a particular threshold is preferably provided in the wall of the shielded enclosure so that the latter's rupture limit is not reached.

The electro-optic voltage sensor therefore has a very high level of safety vis à vis the risk of explosion.

Note that location of the electric line voltage inside the shielded enclosure exploits the compact size of the voltage divider, in particular in the case where the two homogeneous dielectric blocks are vitroceramic blocks.

The shielded enclosure also homogenizes the temperature of the insulative gas in contact with the voltage divider. The two homogeneous dielectric blocks are therefore at substantially the same temperature.

As a result the division ratio R between the total voltage V and the reduced voltage U is independent of the temperature of the insulative gas in the shielded enclosure, so eliminating any drift of the division ratio R due to thermally caused variations in the dielectric permittivity of the material of the two blocks. This is of great benefit in practice given that it is hardly conceivable in industrial terms to provide thermostatic control of the shielded enclosure to guarantee the validity of the division ratio as a function of temperature.

It is also necessary here to emphasize the benefit of the compact size of the voltage divider, which enables fast and complete thermal homogenization of the two homogeneous dielectric blocks, compared to a capacitive column as described previously in which a temperature gradient exists in the lengthwise direction of the column and generates a capacitive variation in the individual capacitors according to their position in the column.

Note finally that the shielded enclosure also provides total protection against electromagnetic interference from other live exterior conductors near the electro-optic sensor. The accuracy of the measured electric line voltage is therefore guaranteed.

The electro-optic voltage sensor therefore has mechanical and thermal stability guaranteeing highly accurate operation and great reliability without special maintenance requirements.

There is claimed:

1. An electro-optic voltage sensor for determining the voltage on an electric line, comprising:
   a voltage divider connected between said electric line and a ground potential, and having two insulative compartments separated by an intermediate electrode, wherein each insulative compartment is a homogeneous dielectric block; and
   at least one Pockels cell connected to said intermediate electrode,
   said intermediate electrode supplying to said at least one Pockels cell a reduced voltage derived from the voltage supplied by said electric line to said voltage divider.

2. The sensor claimed in claim 1 wherein each compartment is a glass or vitroceramic block.

3. The sensor claimed in claim 1 wherein said two homogeneous dielectric blocks are cylindrical in shape and have the same cross-section.

4. The sensor claimed in claim 3 wherein said cross-sections of said two blocks are coated with a conductive deposit.

5. The sensor claimed in claim 4 wherein said intermediate electrode is formed by a conductive adhesive between said two homogeneous dielectric blocks.

6. The sensor claimed in claim 3 wherein one of said two homogeneous dielectric blocks includes an axial opening through which passes a conductive wire connecting said intermediate electrode to said at least one Pockels cell.

7. The sensor claimed in claim 1 wherein said voltage divider and said Pockels cell are disposed in a shielded enclosure.

8. The sensor claimed in claim 7 wherein said voltage divider is adapted to be connected to said electric line by an electric conductor disposed inside an insulator and which extends into said shielded enclosure.

9. The sensor claimed in claim 7 wherein said shielded enclosure or said insulator is adapted to be filled with a dry neutral gas at an average pressure less than 2 bars.

10. The sensor claimed in claim 9 wherein said shielded enclosure incorporates a rupture disk.

11. The sensor claimed in claim 1 wherein one of said homogeneous dielectric blocks is comprised of a different material than the other of said homogeneous blocks.

12. The sensor claimed in claim 7, wherein a frame inside the screened enclosure supports the voltage divider and contains said at least one Pockels cell, said frame being fixed on the base of the shielded enclosure and electrically connected to ground.

13. The sensor claimed in claim 12 wherein the frame contains at least two Pockels cells.

* * * * *